United States Patent
McGinn

(10) Patent No.: US 8,508,250 B2
(45) Date of Patent: Aug. 13, 2013

(54) ASYMMETRICAL BUS KEEPER

(75) Inventor: John Douglas McGinn, Cambridge (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 13/398,929

(22) Filed: Feb. 17, 2012

(65) Prior Publication Data

US 2013/0093465 A1 Apr. 18, 2013

Related U.S. Application Data

(63) Continuation-in-part of application No. 13/272,653, filed on Oct. 13, 2011, now abandoned.

(51) Int. Cl.
*H03K 17/16* (2006.01)

(52) U.S. Cl.
USPC .................. 326/21; 326/27; 326/83

(58) Field of Classification Search
USPC .......................... 326/26, 27, 46, 83
See application file for complete search history.

(56) References Cited

U.S. PATENT DOCUMENTS

| | | | |
|---|---|---|---|
| 5,894,230 A | 4/1999 | Voldman | |
| 6,069,512 A | 5/2000 | Rodriguez et al. | |
| 6,097,229 A | 8/2000 | Hinterscher | |
| 6,484,267 B1 | 11/2002 | Lee et al. | |
| 7,064,593 B2 | 6/2006 | Hinterscher et al. | |
| 7,091,742 B2 * | 8/2006 | Ryan | 326/27 |
| 7,199,658 B2 * | 4/2007 | Floyd et al. | 330/251 |
| 7,474,124 B2 | 1/2009 | Dale et al. | |
| 7,852,116 B2 | 12/2010 | Whetsel | |
| 2001/0048332 A1 | 12/2001 | Soltero et al. | |
| 2003/0185087 A1 | 10/2003 | Hazucha et al. | |
| 2007/0262792 A1 | 11/2007 | Rana et al. | |
| 2008/0150577 A1 | 6/2008 | Ueno | |
| 2008/0224733 A1 | 9/2008 | Dale et al. | |

OTHER PUBLICATIONS

Texas Instruments Incorporated, Implications of Slow or Floating CMOS Inputs, 1998 http://focus.ti.com./lit/an/scba004c/scba004c.pdf.
A.P. Godse, D.A. Godse, Digital Logic Design and Application, 5-32, Flip-Flops, Technical Publications, 2008.
7 pages retrieved from http://en.wikipedia.org/wiki/Logic_family Page last modified May 2, 2011 at 18:11.
3 pages retrieved from http://en.wikipedia.org/wiki/Open_collector Page last modified Feb. 28, 2011 at 19:52.

(Continued)

*Primary Examiner* — Don Le
(74) *Attorney, Agent, or Firm* — Bereskin & Parr LLP/S.E.N.C.R.L., s.r.l.

(57) ABSTRACT

Various embodiments are described herein for an asymmetrical bus keeper circuit that provides asymmetrical drive towards one logic level. The asymmetrical bus keeper circuit comprises a first inverter stage having an input node and an output node, an asymmetrical inverter stage having an input node and an output node and a feedback stage with an input node and an output node. The input node of the asymmetrical inverter stage is connected to the output node of the first inverter stage. The input node of the feedback stage connected to the output node of the asymmetrical inverter stage and the output node of the feedback stage connected to the input node of the first inverter stage. The asymmetrical stage provides asymmetrical drive towards one logic level.

10 Claims, 4 Drawing Sheets

(56) References Cited

OTHER PUBLICATIONS 3 pages retrieved from http://en.wikipedia.org/wiki/Pull-up_resistor Page last modifed on Feb. 7, 2011 at 16:53.
3 pages retrieved from http://en.wikipedia.org/wiki/Three-state_logic Page last modified Dec. 5, 2010 at 01:39.
1 page retrieved from http://en.wikipedia.org/wiki/Bus-holder Page last modified Dec. 4, 2009 at 20:53.
Previously co-pending U.S. Appl. No. 13/272,653, "Asymmetrical Bus Keeper", now abandoned, filed Oct. 13, 2011.
Notice of Abandonment, U.S. Appl. No. No. 13/272,653, dated Mar. 21, 2012.
Confirmation of termination of proceedings, European Patent Application No. 11185119.2, dated Apr. 25, 2012.
European Search Report, European Patent Application No. 07719971.9 dated Feb. 1, 2013.
Document relating to EP Application No. 12155913.2, dated Apr. 30, 2013 (Office Action Response).
Document relating to EP Application No. 12155913.2, dated Feb. 1, 2013 (European Search Report).

* cited by examiner

ASYMMETRICAL BUS KEEPER

CROSS-REFERENCE TO RELATED APPLICATIONS

This application is a continuation-in-part of U.S. patent application Ser. No. 13/272,653, filed Oct. 13, 2011; the entire contents of patent application Ser. No. 13/272,653 is hereby incorporated by reference.

FIELD

The various embodiments described herein generally relate to a bus keeper circuit with an asymmetrical configuration for providing an asymmetrical drive to only one logic level.

BACKGROUND

In computer systems or in some devices that perform computer functions or behave as computers, several circuits or devices are typically connected with one another via a communication bus so that they can communicate with each other. If the devices do not have to provide any information to the bus (i.e. the devices are inactive), the devices go into a high-impedance state. In this case, a pull-up resistor weakly pulls the voltage on the bus to the high logic level. When one of the devices becomes active, it will override the logic level that is maintained by the pull-up resistor in order to communicate on the bus.

In the case of a tri-state bus, there are three scenarios for the output of the devices that are connected to the bus: a logic low level, a logic high level and a floating level (i.e. a tri-state mode where the devices are not active). In contrast to the previous pull-up resistor example, a bus keeper circuit (also known as a bus-holder circuit) is connected to the tri-state bus to weakly hold the last logic value on the bus. This is done to prevent a floating voltage level on the bus since, in this case, the gates of both input transistors of a device that is connected to the tri-state bus can turn on which essentially provides a short-circuit connection between the power supply and ground which can damage the gates. Conventional bus keeper circuits include a first CMOS inverter connected in series to a second CMOS inverter and a resistor connected in series to the second inverter. The transistors used in each inverter have a similar amount of drive and therefore the inverters are symmetrical. The first inverter and the resistor are connected to the tri-state bus such that the bus keeper circuit is connected in parallel with the tri-state bus. The resistor drives the bus weakly to either the low logic level or the high logic level (i.e. whichever was the last logic value on the bus) and the other circuits that are connected to the tri-state bus can override the value of the bus when they are not in the tri-state mode.

The conventional bus keeper circuit is suitable for use with communication buses that have symmetrical impedance drive. However, there are some cases in which the communication bus has an asymmetrical impedance drive. This results in an asymmetrical noise margin between the high and low logic states. This is problematic when glitches occur, since the tri-state bus can be driven to an incorrect logic level when a conventional bus keeper circuit is used.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and in which.

DETAILED DESCRIPTION OF THE EMBODIMENTS

Figure 1:
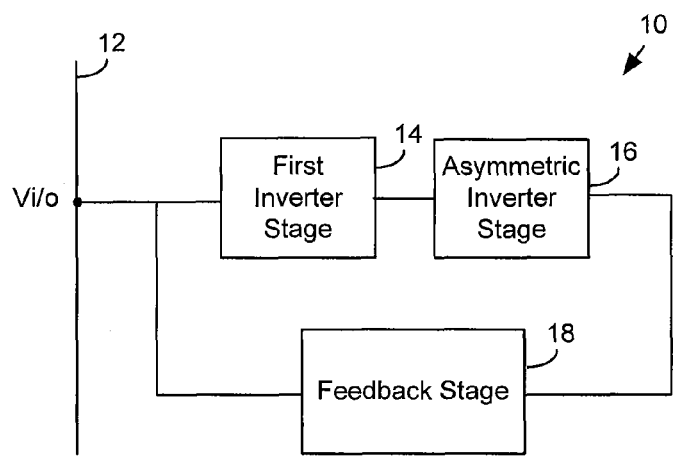
FIG. 1 is a block diagram of an example embodiment of an asymmetrical bus keeper circuit with an asymmetrical inverter stage.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Referring now to FIG. 1, shown therein is a block diagram of an example embodiment of an asymmetrical bus keeper circuit 10. The asymmetrical bus keeper circuit 10 comprises a first inverter stage 14, an asymmetrical inverter stage 16 and a feedback stage 18. The first inverter stage 14 has an input node that is connected to the input/output node (Vi/o) of the circuit 10. The input node of the asymmetrical inverter stage 16 is connected to the output node of the first inverter stage 14. The input node of the feedback stage 18 is connected to the output node of the asymmetrical inverter stage 16 and the output node of the feedback stage 18 is connected to the input node of the first inverter stage 14 and the input/output node (Vi/o) of the circuit 10. The input/output node (Vi/o) of the asymmetrical bus keeper circuit 10 is connected to an asymmetrical bus line 12 to receive an input voltage and provide an output voltage. In other uses, the input of the asymmetrical bus keeper circuit 10 can be connected to a circuit board input.

The first inverter stage 14 comprises transistors that are balanced with one another since they have similar physical sizes and can provide similar current drive (i.e. they have a similar Beta). However, the asymmetrical inverter stage 16 is implemented such that it provides an asymmetrical drive towards one of the logic levels, which is the last logic level that was on the bus line 12. The feedback stage 18 is implemented such that the drive is weak so that it can be over-ridden by other devices. Therefore, the asymmetrical bus keeper circuit 10 provides weak drive in one logic state and no drive in the other logic state. This differs from a conventional bus keeper circuit which provides symmetrical weak drive in both logic states on the bus line 12. This allows the asymmetrical bus keeper circuit 10 to be used with an asymmetrical bus line and to be able to deal with glitches on the asymmetrical bus line, as will be shown in more detail below with regards to FIGS. 3a-3b. An asymmetrical bus line is a bus line which has an asymmetrical bus protocol, which is similar to a floating bus protocol in which more current needs to be driven in one direction (i.e. logic level) than the other.

The implementation of the asymmetrical inverter stage 16 depends on which logic state the asymmetrical bus drives towards. For example, in the case in which the asymmetrical bus drives to the low logic level with low impedance, but floats after a high logic level is achieved, the asymmetrical inverter stage 16 is implemented to provide a weak pull-up when the voltage on the asymmetrical bus line is high, but no pull-up when the voltage on the asymmetrical bus line is low. Conversely, for the case in which the asymmetrical bus line drives to the high logic level with low impedance, but floats after a low logic level is achieved, the asymmetrical inverter stage 16 is implemented to provide a weak pull-down when the voltage on the asymmetrical bus line is low, but no pull-down when the voltage on the asymmetrical bus line is high. In the first case, the pull-up impedance of the bus line 12 can be improved from using a very high resistance to just a few thousand ohms in the high state without causing any current draw in the low state. Likewise, in the second case, the pull-down impedance of the bus line 12 can be improved from using a very high resistance to just a few thousand ohms in the low state without causing any current draw in the high state. While pull-up or pull-down resistors can provide a similar function as the asymmetrical bus keeper circuit 10, these resistors do not turn off in the opposite drive state and therefore waste power in the opposite drive state. Accordingly, the power dissipation associated with the asymmetrical bus keeper circuit 10 is much lower than the power dissipation associated with a conventional symmetrical bus keeper circuit or with bus keeper circuits that use either a pull-up resistor or a pull-down resistor. The reduction in power dissipation in the asymmetrical bus keeper circuits described herein is very important especially in battery-driven devices such as hand-held devices (i.e., devices sized and shaped to be held or carried in a human hand), which may include mobile phones, smart phones, laptops, notepads, tablet computers and the like.

Another advantage of using the asymmetrical bus keeper circuit 10 instead of a conventional symmetrical bus keeper circuit for an asymmetrical bus line is that bus impairments such as ringing or crosstalk, which occur near the logic threshold of the input of the asymmetrical bus keeper circuit 10, will not force the circuit into the incorrect logic state. Therefore, the asymmetrical bus keeper circuit 10 has the ability to restore the bus to the proper logic state on the opposite side of the ring cycle. This is described in further detail with regards to FIGS. 3a-3b.

Figure 2:
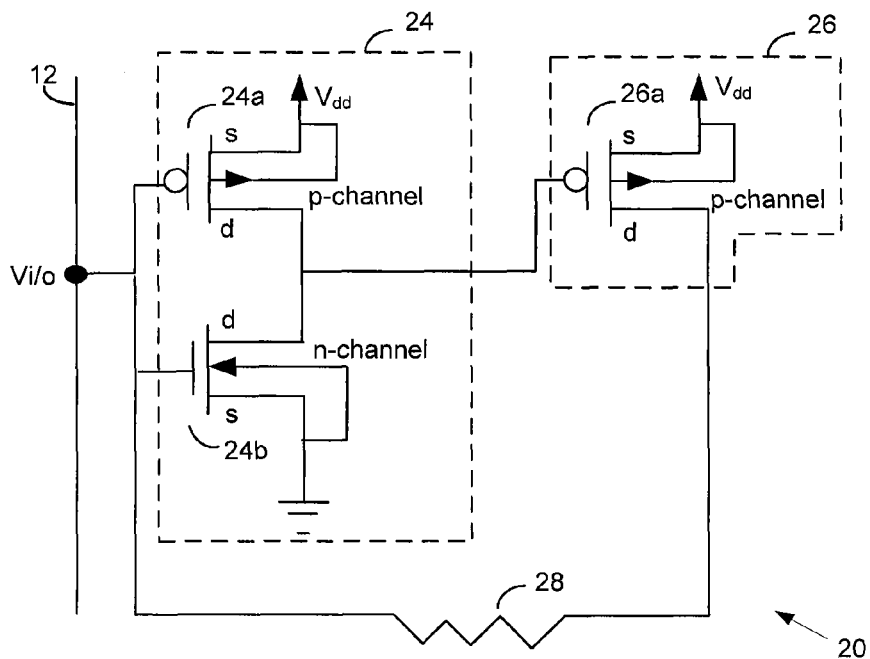
FIG. 2 is a schematic diagram of an example embodiment of an asymmetrical bus keeper circuit with an asymmetrical inverter stage for providing asymmetrical drive to the high logic level.

Referring now to FIG. 2, shown therein is a schematic diagram of an example embodiment of an asymmetrical bus keeper circuit 20 with a first inverter stage 24, an asymmetrical inverter stage 26 and a feedback stage 28. The asymmetrical inverter stage 26 can provide asymmetrical drive to the high logic level and so the asymmetrical bus keeper circuit 20 can be considered to be a pull-up only bus keeper.

The first inverter stage 24 comprises a p-channel transistor 24a and an n-channel transistor 24b in an inverter configuration in which the source of the p-channel transistor 24a is connected to the positive voltage supply level Vdd, the gate of the p-channel transistor 24a is connected to the gate of the n-channel transistor 24b, the drain of the p-channel transistor 24a is connected to the drain of the n-channel transistor 24b and the source of the n-channel transistor 24b is connected to ground. The current drive (i.e. size) of the p-channel and n-channel transistors 24a and 24b are similar so that the first inverter stage 14 operates in a balanced manner. The transistors 24a and 24b are CMOS transistors.

The asymmetrical inverter stage 26 is implemented by using an open drain keeper driver, which is in the form of a single p-channel transistor 26a in this case. The gate of the p-channel transistor 26a is connected to the input node of the asymmetrical inverter stage 26, the source of the p-channel transistor 26a is connected to the positive voltage supply Vdd and the drain of the p-channel transistor 26a is connected to the output node of the asymmetrical inverter stage 26 which is connected to the input node of the feedback stage 28. The drive of the transistor 26a is selected to be similar to the drives of the transistors 24a and 24b.

In an alternative embodiment, the asymmetrical inverter stage 26 can have a p-channel transistor and an n-channel transistor connected in an inverter configuration, similar to transistors 24a and 24b, but with asymmetrical drives. In this case, the upper p-channel transistor in the asymmetrical inverter stage would have a much larger drive (i.e. Beta) than the lower n-channel transistor and the drive of the n-channel transistor would be selected such that it essentially acts as an open circuit. For example, if the output drive of the upper transistor is about 2 mA, then the output drive of the lower transistor can be selected to be about 1 to 3 µA (i.e. three orders of magnitudes lower). However, in general, the output drive of the lower transistor can be about 1 to 4 orders of magnitude smaller than the output drive of the upper transistor.

The feedback stage 28 comprises a resistor having a resistance of 1 kilo-ohm to several kilo-ohms to limit the amount of output current of the asymmetrical bus keeper circuit 20 and ensure that it provides weak drive. In alternative embodiments, which are applicable to all of the circuit schematics shown herein, the feedback stage 28 can also include a capacitor, with a small capacitance, that is placed in parallel with the resistor in order to speed up the feedback.

The asymmetrical bus keeper circuit 10 is useful in situations where a bus line can be driven high or low but it is sometimes left at a high impedance logic level for a short time. When the bus line 12 is being pulled low, no drive is provided as the transistor 26a turns off and effectively acts as an open circuit. Alternatively, when the bus line 12 is being pulled high, the transistor 26a turns on and provides a weak drive through the feedback stage 28 and a weak pull-up to maintain the high logic level on the bus line 12. Therefore, the output of the asymmetrical bus keeper circuit 20 is a weak high logic level when the bus line 12 is being driven high and when the bus line 12 is being driven low, the output of the asymmetrical bus keeper circuit 20 is off. Whenever the voltage on the bus line 12 transitions to the high logic state or the low logic state, there is a momentary transient where the asymmetrical bus keeper circuit 20 is active and conducting current. In the rising voltage level case, the current provided by the asymmetrical bus keeper circuit 20 helps the signal on the bus line 12 rise to the high logic state. In the falling voltage level case, the current provided by the asymmetrical bus keeper circuit 20 opposes the fall in voltage until the signal on the bus line 12 transitions almost to zero Volts. Accordingly, in both the high level and low logic level states on the bus line 12, the asymmetrical bus keeper 20 draws very little or no current. Furthermore, by using a relatively large resistance, as described above, in the feedback stage 28, power consumption is minimized when weak drive is provided by the asymmetrical bus keeper circuit 10. In addition, since a weak drive is provided by the asymmetrical bus keeper circuit 20, contention is avoided since the asymmetrical bus keeper circuit 20 will not be able to pull the bus line 10 high when another device connected to the bus line 10 is trying to pull the bus line 10 low.

The situation in which the voltage on the bus line 12 is at an intermediate voltage in the linear region of a CMOS transistor can be dangerous for CMOS circuits since it will cause both the n-channel and p-channel transistors to turn on (known as "mutual conduction" or "shoot through") and create a short circuit between the positive voltage supply and ground. This short circuit could cause a very large current to flow which would heat the transistors, waste power and possibly damage the transistors depending on how long the voltage on the bus line 12 is in the linear region of the input transistors. However, this situation is not problematic for the asymmetrical bus keeper circuit 20. While both the transistors 24a and 24b would be slightly on in this condition, the result is that the input voltage to the transistor 26a is also at an intermediate voltage so the transistor 26a would be slightly on and the output of the asymmetrical inverter stage 16 would be weakly driven to the power rail (i.e. positive supply voltage level). Therefore, the asymmetrical bus keeper circuit 20 would quickly return the bus line 12 to the high logic level state without the need for a pull-up resistor and therefore also avoid the wasted current and power dissipation that occurs at the pull-up resistor when the asymmetrical bus keeper circuit 20 is in the low logic state.

Figure 3A:
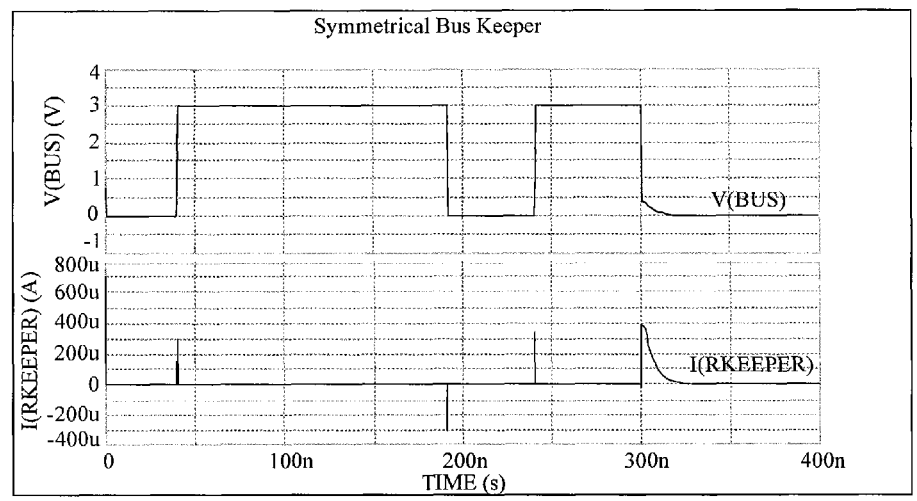
FIG. 3a is an example signal diagram in which the top panel shows the voltage on a bus line and the bottom panel shows the output current of a conventional symmetrical bus keeper circuit.

Referring now to FIG. 3a, shown therein is an example signal diagram in which the top panel shows the voltage on a bus line and the bottom panel shows the output voltage of a conventional symmetrical bus keeper circuit. A voltage glitch occurs on the bus line at 300 nanoseconds which pulls the voltage on the bus line low which results in a conduction of current through the conventional symmetrical bus keeper circuit since the p-channel transistor in the first inverter stage turns on which turns on the n-channel transistor in the second inverter stage. The result is that the n-channel transistor in the second inverter stage weakly holds the output voltage of the conventional symmetrical bus keeper circuit low as can be seen in the top panel of FIG. 3a, which is incorrect and undesirable.

Figure 3B:
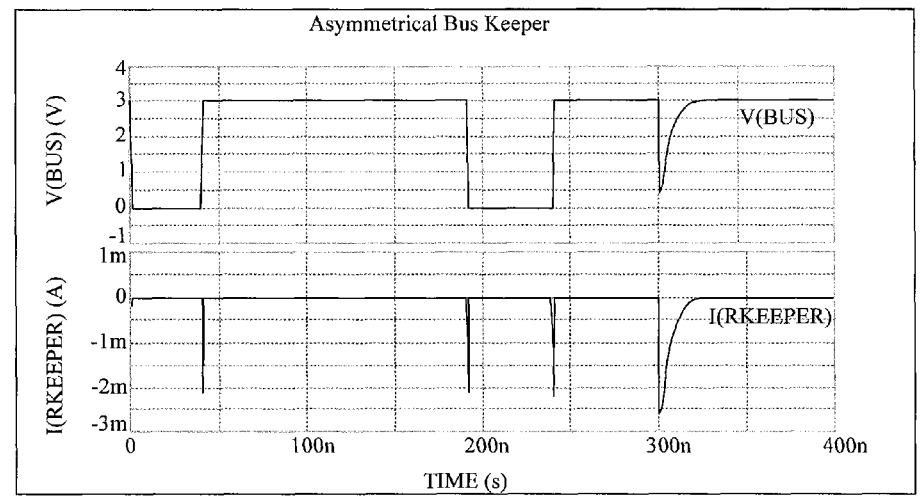
FIG. 3b is an example signal diagram in which the top panel shows the voltage on a bus line and the bottom panel shows the output current of an asymmetrical bus keeper circuit that provides asymmetrical drive to the high logic level.

Referring now to FIG. 3b, shown therein is an example signal diagram in which the top panel is similar to that of FIG. 3a and the bottom panel shows the output current of the asymmetrical bus keeper circuit 20. As can be seen, whenever there is a transition from a low logic level to a high logic level and vice versa on the bus line 12, the asymmetrical bus keeper circuit 20 conducts current for an extremely short period of time. Furthermore, whenever there is a short duration weak negative transient which pulls the voltage on the bus line 12 slightly below the switching threshold of the transistors in the asymmetrical bus keeper circuit 20, the asymmetrical bus keeper circuit 20 stops pulling up the voltage weakly during the transient but does not flip the logic state of the bus line 12 as shown in FIG. 3b. Once the transient ends, if the final state on the bus line 12 is still high impedance but just above the logic high threshold of the transistors in the asymmetrical bus keeper circuit 20, the asymmetrical bus keeper circuit 20 will once again pull the voltage on the bus line 12 up weakly, which is correct and desirable. This is in contrast to the conventional symmetrical bus keeper circuit which flipped the state on the bus line 12 to the logic low level.

Figure 4:
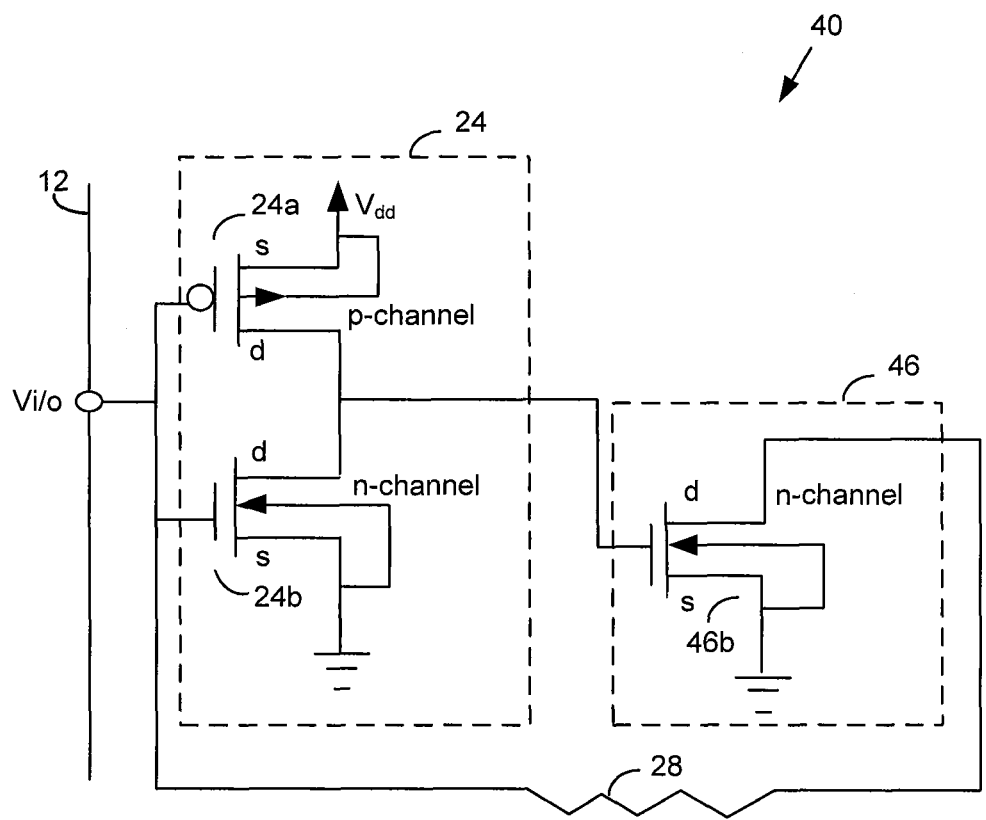
FIG. 4 is a schematic diagram of another example embodiment of an asymmetrical bus keeper circuit with an asymmetrical inverter stage for providing asymmetrical drive to the low logic level.

Referring now to FIG. 4, shown therein is a schematic diagram of another example embodiment of an asymmetrical bus keeper circuit 40 with an asymmetrical inverter stage 46 for providing asymmetrical drive to the low logic level for the bus line 12. The asymmetrical inverter stage 46 is in an open-drain configuration. The asymmetrical bus keeper circuit 40 provides a weak pull-down when the bus line 12 is at the logic low level and provides no pull-up when the bus line 12 is at the logic high level. Accordingly, the asymmetrical bus keeper circuit 40 operates in an opposite manner as the asymmetrical bus keeper circuit 20 with respect to drive and logic level but it provides all of the same benefits as the asymmetrical bus keeper circuit 20.

The asymmetrical inverter stage 46 is implemented by using an open drain keeper driver, which is in the form of a single n-channel transistor 46b in this case. The gate of the n-channel transistor 46b is connected to the input node of the asymmetrical inverter stage 46, the source of the n-channel transistor 46b is connected to ground and the drain of the n-channel transistor 46b is connected to the output node of the asymmetrical inverter stage 46. The output node of the asymmetrical inverter stage 46 is connected to the input node of the feedback stage 28. The drive of the transistor 46b is selected to be similar to the drives of the transistors 24a and 24b.

In an alternative embodiment, the asymmetrical inverter stage 46 can have a p-channel transistor and an n-channel transistor connected in an inverter configuration, similar to transistors 24a and 24b, but with asymmetrical drives. In this case, the upper p-channel transistor in the asymmetrical inverter stage would have a much smaller drive (i.e. Beta) than the lower n-channel transistor and the drive of the p-channel transistor would be selected such that it essentially acts as an open circuit. For example, if the output drive of the lower transistor is about 2 mA, then the output drive of the upper transistor can be selected to be about 1 to 3 µA (i.e. three orders of magnitudes lower). However, in general, the output drive of the lower transistor can be about 1 to 4 orders of magnitude larger than the output drive of the upper transistor.

For the situation in which the voltage on the bus line 12 is at an intermediate voltage in the linear region of a CMOS transistor, both the transistors 24a and 24b would be slightly on in this condition, but the input voltage to the transistor 46b is also at an intermediate voltage so the transistor 46b would be slightly on and the output of the asymmetrical inverter stage 46 would be weakly driven to ground. Therefore, the asymmetrical bus keeper circuit 40 would quickly return the bus line 12 to the low logic level state without the need for a pull-down resistor and therefore also avoid the wasted current and power dissipation that occurs at the pull-down resistor when the asymmetrical bus keeper circuit 20 is in the high logic state.

It should be understood that the signal diagrams of FIG. 3b and the properties of the asymmetrical bus keeper circuits 10 and 20, such as in dealing with glitches for example, also apply to the asymmetrical bus keeper circuit 40. However, the signal diagram for the asymmetrical bus keeper circuit 40 would be the opposite of what is shown in FIG. 3b. Accordingly, when the bus line 12 is at a low logic level and a short duration weak positive transient (i.e. glitch) occurs that increases the voltage level slightly above the switching threshold of the transistors in a bus keeper circuit, a conventional symmetrical bus keeper circuit would flip the logic state and hold the bus line 12 at a high logic level. However, the asymmetrical bus keeper circuit 40 would stop pulling down the voltage weakly during the transient but would not flip the logic state of the bus line 12. Once the transient ends, if the final state on the bus line 12 is still a low logic level, the asymmetrical bus keeper circuit 40 will once again pull the voltage on the bus line 12 low weakly.

Figure 5:
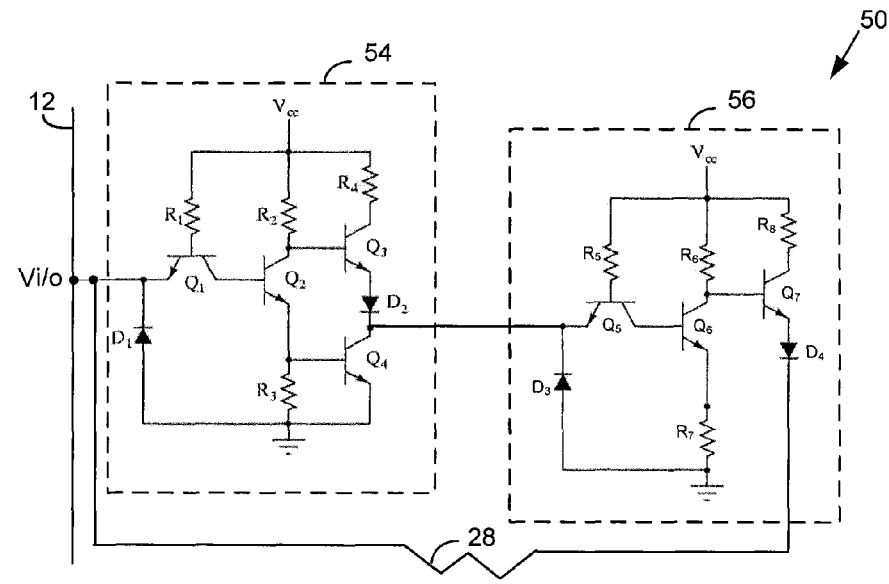
FIG. 5 is a schematic diagram of an example embodiment of an asymmetrical bus keeper circuit that uses Bipolar Junction Transistors (BJT) with an asymmetrical inverter stage for providing asymmetrical drive to the high logic level.
Figure 6:
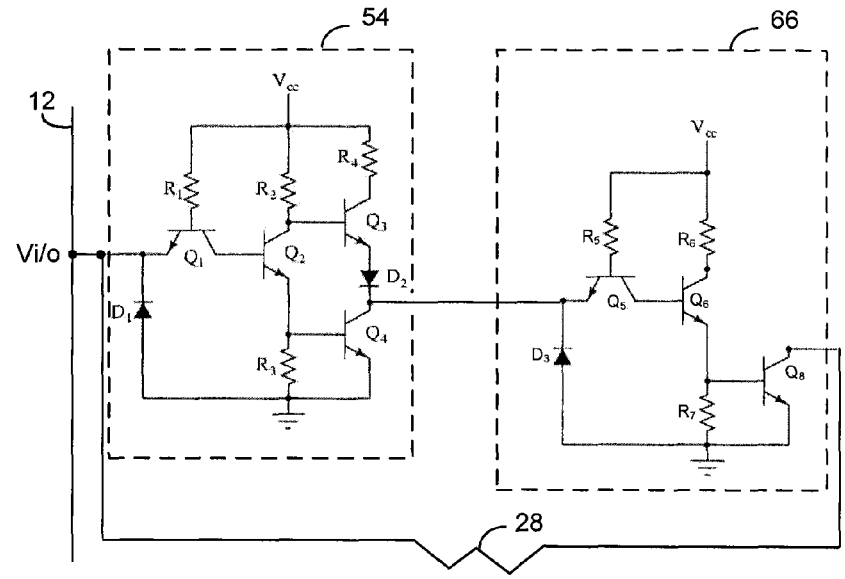
FIG. 6 is a schematic diagram of another example embodiment of an asymmetrical bus keeper circuit that uses BJT transistors with an asymmetrical inverter stage for providing asymmetrical drive to the low logic level.

The asymmetrical bus keeper concept can also be extended to Bipolar Junction Transistor (BJT) based bus keeper circuits. There are a large number of BJT inverter structures that currently exist which differ in speed, power, input impedance, output level, supply voltage and the like, as well as logic family such as Resistor Transistor Logic (RTL), Diode Transistor Logic (DTL), Emitter-Coupled Logic (ECL) and the like. While there are a large number of BJT inverter structures, the concept of asymmetrical drive can be extended to these different BJT inverter structures to form asymmetrical BJT bus keeper circuits by modifying the circuit topology in the second inverter stage such that it provides asymmetrical drive to either one of the logic levels. Generally, all of these different BJT inverter topologies have a totem pole output structure and asymmetrical drive can be obtained by modifying the totem pole output structure. This is shown in FIG. 5 for an example embodiment of an asymmetrical BJT bus keeper circuit 50 that uses a particular BJT inverter structure. The asymmetrical bus keeper circuit 50 includes a symmetrical inverter stage 54 and an asymmetrical inverter stage 56 for providing asymmetrical drive to the high logic level. Another example embodiment of an asymmetrical BJT bus keeper circuit 60 is shown in FIG. 6. The asymmetrical BJT bus keeper circuit 60 includes the symmetrical inverter stage 54 and an asymmetrical inverter stage 66 that provides asymmetrical drive to the low logic level. In both of these example embodiments, the totem pole output structure of the symmetrical inverter stage 54 includes a resistor R4, a transistor Q3, a diode D2 and another transistor Q4 connected in series. However, an asymmetrical drive can be obtained by removing one of the two transistors in the totem pole output structure of the asymmetrical inverter stages 56 and 66. For the asymmetrical inverter stage 56, the upper portion of the totem pole output structure has a transistor Q7 but not the lower portion of the totem pole output structure thereby providing asymmetrical drive to the high logic level. For the asymmetrical inverter stage 66, the lower portion of the totem pole output structure has a transistor Q8 but not the upper portion of the totem pole output structure thereby providing asymmetrical drive to the low logic level.

In both of these example embodiments, the resistances of the resistors and the size of the transistors in the symmetrical inverter stage 54 are selected depending on the magnitude of the supply voltage and the corresponding required drive current as is known by those skilled in the art. The resistances of the resistors and the sizes of the transistors in the asymmetrical inverter stages 56 and 66 are then selected in a corresponding fashion. For instance, the BJT transistors all have generally similar current drive. The advantages and operation described for the asymmetrical bus keeper circuit 20 generally applies to the asymmetrical BJT bus keeper circuit 50 while the advantages and operation described for the asymmetrical bus keeper circuit 40 generally applies to the asymmetrical BJT bus keeper circuit 60.

In alternative embodiments, the asymmetrical inverter stages 56 and 66 can have a similar circuit topology as the symmetrical inverter stage 54, however, the drive of the transistors in the upper and lower portion of the totem pole output structure are substantially different from one another to provide asymmetrical drive. In this alternative, the asymmetrical inverter stage 56 includes the resistor R8, the transistors Q7 and Q8 and the diode D4. The base of the transistor Q8 is connected to the emitter of the transistor Q6, the collector of the transistor Q8 is connected to the cathode of the diode D4, and the emitter of the transistor Q8 is connected to ground. The collector of the transistor Q8 provides an output node for the asymmetrical inverter stage which is connected to the feedback stage 28. In order to provide similar functionality as the asymmetrical BJT bus keeper circuit 50, the drive of the transistor Q7, in the upper portion of the totem pole output structure, is about 3 orders of magnitude greater than the drive of the transistor Q8, although in general the drive of the transistor Q7 can be in the range of 1 to 4 orders of magnitude greater than the drive of the transistor Q8. Alternatively, in order to provide similar functionality as the asymmetrical BJT bus keeper circuit 60, the drive of the transistor Q8, in the lower portion of the totem pole output structure, is about 3 orders of magnitude greater than the drive of the transistor Q7, although in general the drive of the transistor Q8 can be in the range of 1 to 4 orders of magnitude greater than the drive of the transistor Q7.

In an alternative, the CMOS and BJT asymmetrical bus keeper circuits discussed herein that provide a weak pull-up can be modified by adding a large resistor, on the order of a Mega-ohm or so, between the input node of the asymmetrical bus keeper circuit and the positive supply voltage Vdd or Vcc as the case may be. This resistor can be used to prevent metastability, which may occur in some cases depending on the nature of the bus (i.e. whether it is asynchronous rather than synchronous and/or whether more than one independent clock system is used). Metastability occurs when an intermediate (i.e. not high but not low) voltage is applied to the input/output node of the asymmetrical bus keeper circuit in which case the voltage at the input/output node may take an indeterminate amount of time to settle to the desired logic value.

In another alternative, the CMOS and BJT asymmetrical bus keeper circuits discussed herein that provide a weak pull-down can be modified by adding a large resistor, on the order of a Mega-ohm or so, between the input/output node of the asymmetrical bus keeper circuit and ground to prevent metastability as was just discussed.

In the CMOS and BJT asymmetrical bus keeper circuits discussed herein, the asymmetrical feedback will always eventually result in saturation to the high or low logic state level, but in some cases this process might take a non-trivial amount of time. During this time, at the intermediate voltage on the input/output node, the first CMOS inverter stage will waste power while in the BJT cases some power, although not as much as in the CMOS case, will be wasted at the intermediate input voltage. Accordingly, in another alternative, for some cases depending on how the asymmetrical bus keeper circuits are used, it can be beneficial to modify the CMOS and BJT asymmetrical bus keeper circuits discussed herein that provide asymmetrical drive to the high logic level by adding a very large resistor between the output node of the asymmetric inverter stage and the positive voltage supply Vdd or Vcc, as the case may be, to prevent this ambiguous floating mid-voltage logic state in the asymmetrical bus keeper circuits. This pull-up resistor can have a resistance on the order of 100 kilo-ohms to 1 Mega-ohm. The pull-up resistor can shorten the time required to get out of the linear region by several orders of magnitude. In a likewise fashion, for some cases depending on how the asymmetrical bus keeper circuits are used, it can be beneficial to modify the CMOS and BJT asymmetrical bus keeper circuits discussed herein that provide asymmetrical drive to the logic low level by adding a very large resistor between the output node of the asymmetrical inverter stage and ground to prevent the ambiguous floating mid-voltage logic state in the asymmetrical bus keeper circuits. This resistor can have a resistance on the order of 100 kilo-ohms to 1 Mega-ohm.

The asymmetrical bus keeper circuits described herein can be used with an asymmetrical bus which requires an asymmetrical termination. The asymmetrical bus keeper circuits described herein can also be used to connect several electronic devices together, to connect an electronic device to a peripheral device or an external device, or to connect several Integrated Circuits (ICs) together.

The asymmetrical bus keeper circuits described herein can also be used within an IC as well as in dynamic logic circuits. Dynamic logic circuits set a node to the high or low logic level and then let the node float until either another device changes the logic state or the logic state of the node is read out. In particular, in dynamic logic, only one device may drive the bus to one logic state (for example a high logic level) but all other devices attached to the node or bus may only ever drive the bus to the opposite logic state (i.e. the low logic level). In dynamic logic, an initial logic high state may be imposed on a node or bus by one device and then one or more other devices may subsequently either not drive the node at all or drive the node or bus to the logic low level at a later time in a wired "AND" configuration. If none of the other devices drive the node low then the bus remains in the logic high state but is vulnerable to noise due to no active drive to the high state. If any device were to drive it low, then it would not be vulnerable to noise since the logic low driver would be at low impedance. Thus, the bus drive is asymmetrical. This results in an asymmetrical noise margin between the high and low logic states. For instance, in the dynamic logic example, the high logic state noise margin may be as little as 0 Volts, whereas the low logic state noise margin is the difference between the logic low output level and the input threshold for the logic high output level.

In one aspect, at least one example embodiment described herein, there is provided an asymmetrical bus keeper circuit that comprises a first inverter stage having an input node and an output node; an asymmetrical inverter stage having an input node and an output node; the input node of the asymmetrical inverter stage being connected to the output node of the first inverter stage; and a feedback stage with an input node and an output node, the input node of the feedback stage being connected to the output node of the asymmetrical inverter stage and the output node of the feedback stage being connected to the input node of the first inverter stage. The asymmetrical stage provides an asymmetrical drive towards one logic level.

In at least some embodiments, the feedback stage comprises a resistor.

In at least some embodiments, the asymmetrical inverter stage is configured to provide the asymmetrical drive to a high logic level and the asymmetrical inverter stage comprises a single p-channel transistor wherein a gate of the p-channel transistor is connected to the input node of the asymmetrical inverter stage, a source of the p-channel transistor is connected to a positive voltage supply level, and a drain of the p-channel transistor is connected to the output node of the asymmetrical inverter stage.

In at least some embodiments, the asymmetrical inverter stage is configured to provide the asymmetrical drive to a high logic level and the asymmetrical inverter stage comprises a p-channel transistor having a first drive and an n-channel transistor having a second drive, the p-channel and n-channel transistors being oriented in an inverter configuration, wherein the first drive is at one order of magnitude larger than the second drive.

In at least some embodiments, the asymmetrical inverter stage is configured to provide the asymmetrical drive to a low logic level and the asymmetrical inverter stage comprises a single n-channel transistor wherein a gate of the n-channel transistor is connected to the input node of the asymmetrical inverter stage, a source of the n-channel transistor is connected to ground, and a drain of the n-channel transistor is connected to the output node of the asymmetrical inverter stage.

In at least some embodiments, the asymmetrical inverter stage is configured to provide the asymmetrical drive to a low logic level and the asymmetrical inverter stage comprises a p-channel transistor having a first drive and an n-channel transistor having a second drive, the p-channel and n-channel transistors being oriented in an inverter configuration, wherein the second drive is at least one order of magnitude larger than the first drive.

In at least some embodiments, the asymmetrical inverter stage is configured to provide the asymmetrical drive to a high logic level and the asymmetrical bus keeper circuit further comprises a pull-up resistor connected between the input node of the first inverter stage and a positive voltage supply level.

In at least some embodiments, the asymmetrical inverter stage is configured to provide the asymmetrical drive to a low logic level and the asymmetrical bus keeper circuit further comprises a pull-down resistor connected between the input node of the first inverter stage and ground.

In at least some embodiments, the asymmetrical inverter stage is configured to provide the asymmetrical drive to a high logic level and the asymmetrical bus keeper circuit further comprises a resistor connected between the output node of the asymmetrical inverter stage and the positive voltage supply level.

In at least some embodiments, the asymmetrical inverter stage is configured to provide the asymmetrical drive to a low logic level and the asymmetrical bus keeper circuit further comprises a resistor connected between the output node of the asymmetrical inverter stage and ground.

In at least some embodiments, the symmetrical and asymmetrical inverter stages comprise bipolar junction transistors and the asymmetrical inverter stage comprises a totem pole output structure with only an upper portion having a bipolar junction transistor to provide the asymmetrical drive to a high logic level.

In at least some embodiments, the symmetrical and asymmetrical inverter stages comprise bipolar junction transistors and the asymmetrical inverter stage comprises a totem pole output structure with only a lower portion having a bipolar junction transistor to provide the asymmetrical drive to a low logic level.

In at least some embodiments, the symmetrical and asymmetrical inverter stages comprise bipolar junction transistors and the asymmetrical inverter stage comprises a totem pole output structure with an upper portion having a bipolar junction transistor with a first drive and a lower portion having a bipolar junction transistor with a second drive, wherein the first drive is at least one order of magnitude larger than the second drive to provide the asymmetrical drive to a high logic level.

In at least some embodiments, the symmetrical and asymmetrical inverter stages comprise bipolar junction transistors and the asymmetrical inverter stage comprises a totem pole output structure with an upper portion having a bipolar junction transistor with a first drive and a lower portion having a bipolar junction transistor with a second drive, wherein the second drive is at least one order of magnitude larger than the first drive to provide the asymmetrical drive to a low logic level.

It should be understood that various modifications can be made to the embodiments described and illustrated herein, without departing from the embodiments, the general scope of which is defined in the appended claims.

The invention claimed is:

1. An asymmetrical bus keeper circuit comprising:
 a first inverter stage having an input node and an output node;
 an asymmetrical inverter stage having an input node and an output node; the input node of the asymmetrical inverter stage being connected to the output node of the first inverter stage; and
 a feedback stage with an input node and an output node, the input node of the feedback stage being connected to the output node of the asymmetrical inverter stage and the output node of the feedback stage being connected to the input node of the first inverter stage,
wherein the asymmetrical stage provides an asymmetrical drive towards one logic level and wherein the asymmetrical inverter stage comprises a single transistor when implemented using CMOS transistors or a single half of an output totem pole structure when implemented using BJT transistors.

2. The asymmetrical bus keeper circuit of claim 1, wherein the feedback stage comprises a resistor.

3. The asymmetrical bus keeper circuit of claim 1, wherein the asymmetrical inverter stage is configured to provide the asymmetrical drive to a high logic level and the asymmetrical inverter stage comprises a single p-channel transistor wherein a gate of the p-channel transistor is connected to the input node of the asymmetrical inverter stage, a source of the p-channel transistor is connected to a positive voltage supply level, and a drain of the p-channel transistor is connected to the output node of the asymmetrical inverter stage.

4. The asymmetrical bus keeper circuit of claim 1, wherein the asymmetrical inverter stage is configured to provide the asymmetrical drive to a low logic level and the asymmetrical inverter stage comprises a single n-channel transistor wherein a gate of the n-channel transistor is connected to the input node of the asymmetrical inverter stage, a source of the n-channel transistor is connected to ground, and a drain of the n-channel transistor is connected to the output node of the asymmetrical inverter stage.

5. The asymmetrical bus keeper circuit of claim 1, wherein the asymmetrical inverter stage is configured to provide the asymmetrical drive to a high logic level and the asymmetrical bus keeper circuit further comprises a pull-up resistor connected between the input node of the first inverter stage and a positive voltage supply level.

6. The asymmetrical bus keeper circuit of claim 1, wherein the asymmetrical inverter stage is configured to provide the asymmetrical drive to a low logic level and the asymmetrical bus keeper circuit further comprises a pull-down resistor connected between the input node of the first inverter stage and ground.

7. The asymmetrical bus keeper circuit of claim 1, wherein the asymmetrical inverter stage is configured to provide the asymmetrical drive to a high logic level and the asymmetrical bus keeper circuit further comprises a resistor connected between the output node of the asymmetrical inverter stage and the positive voltage supply level.

8. The asymmetrical bus keeper circuit of claim 1, wherein the asymmetrical inverter stage is configured to provide the asymmetrical drive to a low logic level and the asymmetrical bus keeper circuit further comprises a resistor connected between the output node of the asymmetrical inverter stage and ground.

9. The asymmetrical bus keeper circuit of claim 1, wherein the symmetrical and asymmetrical inverter stages comprise bipolar junction transistors and the asymmetrical inverter stage comprises a totem pole output structure with only an upper portion having a bipolar junction transistor to provide the asymmetrical drive to a high logic level.

10. The asymmetrical bus keeper circuit of claim 1, wherein the symmetrical and asymmetrical inverter stages comprise bipolar junction transistors and the asymmetrical inverter stage comprises a totem pole output structure with only a lower portion having a bipolar junction transistor to provide the asymmetrical drive to a low logic level.

* * * * *